(12) United States Patent
Nitta et al.

(10) Patent No.: US 7,163,894 B2
(45) Date of Patent: Jan. 16, 2007

(54) SEMICONDUCTOR DEVICE HAVING A WIRING LAYER OF DAMASCENE STRUCTURE AND METHOD FOR MANUFACTURING THE SAME

(75) Inventors: Hiroyuki Nitta, Yokohama (JP); Yoshiaki Fukuzumi, Yokohama (JP); Yusuke Kohyama, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 144 days.

(21) Appl. No.: 10/927,079

(22) Filed: Aug. 27, 2004

(65) Prior Publication Data
US 2005/0023696 A1 Feb. 3, 2005

Related U.S. Application Data

(62) Division of application No. 09/883,210, filed on Jun. 19, 2001, now Pat. No. 6,906,419.

(30) Foreign Application Priority Data
Jun. 20, 2000 (JP) .............................. 2000-185152

(51) Int. Cl.
*H01L 21/4763* (2006.01)

(52) U.S. Cl. ....................... 438/687; 438/627; 438/639; 438/637; 438/619; 257/E21.583; 257/E21.585; 257/E21.584

(58) Field of Classification Search ................ 438/778, 438/627–639, 687, 579–596, 597, 619; 257/E21.585, 257/E12.586, E21.579, E21.58, E21.583, 257/E21.584
See application file for complete search history.

(56) References Cited

U.S. PATENT DOCUMENTS

| | | | | |
|---|---|---|---|---|
| 5,324,683 A | * | 6/1994 | Fitch et al. ................. | 438/422 |
| 5,374,849 A | * | 12/1994 | Tada .......................... | 257/751 |
| 5,714,804 A | * | 2/1998 | Miller et al. ................ | 257/763 |
| 5,872,053 A | * | 2/1999 | Smith ......................... | 438/626 |
| 6,156,639 A | * | 12/2000 | Fukao et al. ................ | 438/629 |
| 6,159,818 A | * | 12/2000 | Durcan et al. .............. | 438/387 |
| 6,228,763 B1 | * | 5/2001 | Lee ............................ | 438/639 |
| 6,236,079 B1 | * | 5/2001 | Nitayama et al. ........... | 257/306 |
| 6,359,328 B1 | * | 3/2002 | Dubin ........................ | 257/622 |
| 6,362,073 B1 | * | 3/2002 | Kim ........................... | 438/422 |
| 6,380,628 B1 | * | 4/2002 | Miller et al. ................ | 257/762 |
| 6,472,266 B1 | * | 10/2002 | Yu et al. ..................... | 438/241 |
| 6,602,773 B1 | * | 8/2003 | Lee et al. .................... | 438/586 |
| 6,610,597 B1 | * | 8/2003 | Kobayashi .................. | 438/653 |
| 6,867,539 B1 | * | 3/2005 | McCormick et al. ....... | 313/504 |

OTHER PUBLICATIONS

Miyashita et al., "A Novel Bit-Line Process Using Poly-Si Masked Dual-Damascene (PMDD) for 0.13 µm DRAMs and Beyond", IEDH Tech. 2000, pp. 361-362, Dec. 2000.

* cited by examiner

*Primary Examiner*—B. William Baumeister
*Assistant Examiner*—Igwe U. Anya
(74) *Attorney, Agent, or Firm*—Banner & Witcoff, Ltd

(57) ABSTRACT

In a semiconductor device, a wiring pattern groove is formed in a surface portion of a silicon oxide film provided above a semiconductor substrate. A wiring layer is buried into the wiring pattern groove with a barrier metal film interposed therebetween. The barrier metal film is selectively removed from each sidewall portion of the wiring pattern groove. In other words, the barrier metal film is left only on the bottom of the wiring pattern groove. Thus, a damascene wiring layer having a hollow section whose dielectric constant is low between each sidewall of the wiring pattern groove and each side of the wiring layer can be formed in the semiconductor device.

21 Claims, 7 Drawing Sheets

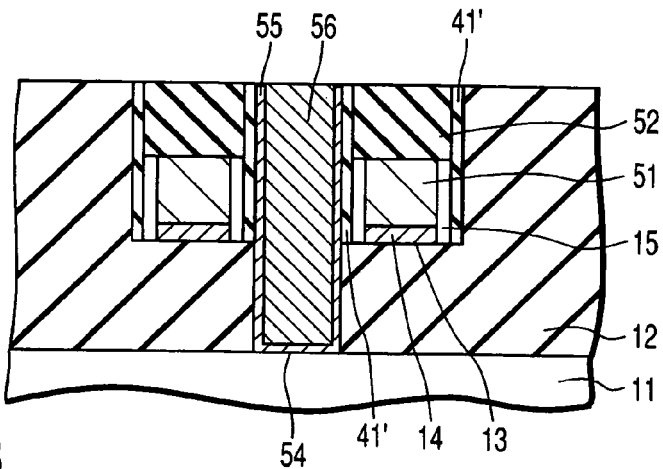
F I G. 8

SEMICONDUCTOR DEVICE HAVING A WIRING LAYER OF DAMASCENE STRUCTURE AND METHOD FOR MANUFACTURING THE SAME

CROSS-REFERENCE TO RELATED APPLICATIONS

This application is a Divisional of U.S. application Ser. No. 09/883,210 filed on Jun. 19, 2001 now U.S. Pat. No. 6,906,419, hereby incorporated by reference as to its entirety. This application is based upon and claims the benefit of priority from the prior Japanese Patent Application No. 2000-185152, filed Jun. 20, 2000, the entire contents of which are incorporated herein by reference.

BACKGROUND OF THE INVENTION

The present invention relates to a semiconductor device having a wiring layer of damascene structure and a method for manufacturing the semiconductor device. More specifically, the present invention relates to a damascene technique that is very useful for miniaturizing a semiconductor device and decreasing the size of a chip.

Miniaturization of semiconductor devices has recently been advanced to make a wiring layer difficult to form by conventional RIE (Reactive Ion Etching). This difficulty is ascribed to difficulties in improvement of yields and flattening when a conductive film is microfabricated by the RIE. As a technique of resolving this problem, a wiring layer of damascene structure (referred to as a damascene wiring layer) has been known conventionally.

FIGS. 9A to 9C schematically show a process of manufacturing a prior art semiconductor device having a damascene wiring layer (a method of forming a damascene wiring layer).

First, an interlayer insulation film 101 is formed on a semiconductor substrate 100 and a wiring pattern groove 103 is formed in the interlayer insulation film 101 by known lithography and RIE, as shown in FIG. 9A. Then, a barrier metal film 105 is deposited on the entire surface of the resultant structure, as illustrated in FIG. 9B. A conductive film 107 is deposited on the barrier metal layer 105 to completely fill the wiring pattern groove 103.

After that, the surface of the resultant structure is flattened by CMP (chemical mechanical polishing), as shown in FIG. 9C. A damascene wiring layer 109 is thus obtained in which the conductive film 107 and the barrier metal film 105 are buried into the wiring pattern groove 103.

A multilevel wiring layer can easily be formed if the above-described process is repeated.

In forming a damascene wiring layer, however, it was necessary to deposit titanium nitride (TiN), niobium (Nb) and the like as a barrier metal film 105 in order to bury tungsten (W), aluminum (Al) and the like in the wiring pattern groove 103 as the conductive film 107. The barrier metal film 105 increases in adhesion to the interlayer insulation film 101 of tungsten (W) and serves as a glue layer or a barrier layer in reflowing of aluminum (Al).

The resistivity of the barrier metal film 105 is generally higher than that of the conductive film 107. Therefore, the prior art semiconductor device described above had a problem that the resistance of the damascene wiring layer was higher than a wiring layer formed by the RIE method (referred to as an RIE wiring layer hereinafter).

FIGS. 10A and 10B illustrate a damascene wiring layer and an RIE wiring layer having the same line width L for purposes of comparison.

In the damascene wiring layer 109 shown in FIG. 10A, the barrier metal film 105 is formed on each sidewall of the conductive film 107. Thus, the width L' of the conductive film 107 is smaller than the line width L of the damascene wiring layer 109 by two times (2b) the thickness of the barrier metal film 105 (L'=L−2b<L). In the RIE wiring layer 201 shown in FIG. 10B, the width L' of the conductive film 107 is equal to the line width L of the RIE wiring layer 201 (L'=L). In other words, the cross-sectional area (volume) of the conductive film 107 in the damascene wiring layer 109 is relatively smaller than that in the RIE wiring layer 201.

The thickness (b) of the barrier metal film 105 is determined appropriately to serve as a glue layer for forming the conductive film 107, to secure adhesion enough to form the film 107, or to obtain good characteristics of contact with the interlayer insulation film 101. In short, the barrier metal film 105 having a given thickness or more is indispensable for forming the damascene wiring layer 109.

If the damascene technique is applied to the formation of wiring, the volume of the barrier metal film in the wiring increases relatively as a semiconductor device decreases in size. As a result, the cross-sectional area of the conductive film decreases and thus the resistance of the wiring increases, or a so-called thin-wire effect is problematic.

The above barrier metal film has the problems that it hardly contributes to a reduction in wiring resistance and narrows a distance between adjacent wiring layers and increases the capacitance between them.

The prior art damascene wiring layer has the problems that the wiring resistance increases and the wiring-to-wiring capacitance increases though the conductive film is improved in yield and easily flattened and the semiconductor device can sufficiently be miniaturized.

BRIEF SUMMARY OF THE INVENTION

An object of the present invention is to provide a semiconductor device capable of preventing wiring resistance from increasing and preventing wiring-to-wiring capacitance from increasing and easily improving in performance, and a method for manufacturing the semiconductor device.

In order to attain the above object, a semiconductor device according to a first aspect of the present invention comprises a first insulation film provided above a semiconductor substrate, a conductive film selectively provided at least on a bottom of a groove section formed in the first insulation film and a wiring layer formed on the conductive film so as to have a space region between the wiring layer and at least one sidewall of the groove section.

A semiconductor device according to a second aspect of the present invention comprises a first insulation film provided above a semiconductor substrate, a wiring layer buried in the first insulation film, a conductive film provided at least on a bottom of the wiring layer, and a fourth insulation film formed on at least one side of the wiring layer, the fourth insulation film being different from the first insulation film.

A semiconductor device according to a third aspect of the present invention comprises an insulation film provided above a semiconductor substrate, a wiring layer buried in the insulation film, a first conductive film provided at least on a bottom of the wiring layer, and a second conductive film formed on at least one side of the wiring layer.

A semiconductor device according to a fourth aspect of the present invention comprises a first insulation film provided above a semiconductor substrate, at least two wiring layers buried in the first insulation film, a first conductive film provided on a bottom of each of the wiring layers, a fifth insulation film formed on at least one side of each of the wiring layers, and a contact plug provided between the two wiring layers with the fifth insulation film interposed therebetween.

A method of manufacturing a semiconductor device according to a fifth aspect of the present invention, comprises the steps of forming a groove section in a first insulation film provided above a semiconductor substrate, forming a first conductive film on the first insulation film along the groove section, forming a buried wiring layer in the groove section with the first conductive film interposed therebetween, and selectively removing the first conductive film from at least one sidewall portion of the groove section to form a space region between the sidewall portion and one side of the wiring layer.

A method of manufacturing a semiconductor device according to a sixth aspect of the present invention, comprises the steps of forming a groove section in a first insulation film provided above a semiconductor substrate, forming a third insulation film on at least one sidewall portion of the groove section, forming a first conductive film in the groove section along the third insulation film, forming a buried wiring layer in the groove section with the first conductive film interposed therebetween, and selectively removing the third insulation film from at least one sidewall portion of the groove section to form a space region between the sidewall portion and one side of the wiring layer.

A method of manufacturing a semiconductor device according to a seventh aspect of the present invention, comprises the steps of forming at least two groove sections in a first insulation film provided above a semiconductor substrate, forming a first conductive film on the first insulation film along each of the two groove sections, forming a buried wiring layer in each of the two groove section with the first conductive film interposed therebetween, selectively removing the first conductive film from at least one sidewall portion of each of the two groove section, and forming a contact plug between the two groove sections with a fifth insulation film interposed therebetween.

According to the semiconductor device and the method for manufacturing the same described above, the sidewall portions of a groove section can effectively be used. Thus, the wiring resistance can easily be decreased and so can be the wiring-to-wiring capacitance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a cross-sectional view showing another example of the semiconductor device according to the sixth embodiment of the present invention;

DETAILED DESCRIPTION OF THE INVENTION

Embodiments of the present invention will now be described with reference to the accompanying drawings.

(First Embodiment)

Figure 1:
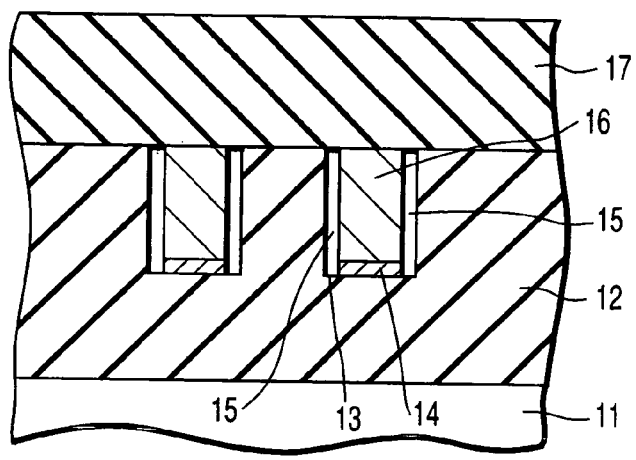
FIG. 1 is a cross-sectional view showing a main portion of a semiconductor device having a damascene wiring layer according to a first embodiment of the present invention.

FIG. 1 schematically shows a cross section of a semiconductor device having a damascene wiring layer according to a first embodiment of the present invention.

In FIG. 1, a silicon oxide film (insulation film/first insulation film) 12 is provided directly or indirectly on a semiconductor substrate 11. A wiring pattern groove (groove section) 13 is formed in a surface portion of the silicon oxide film 12. A barrier metal film (conductive film/first conductive film) 14 is selectively formed only on the bottom of the groove 13. A wiring layer 16, which is constituted of a conductive film, is provided on the barrier metal film 14. A hollow section (space region) 15 is formed between each sidewall of the groove 13 and each side of the wiring layer 16. The wiring layer 16 is almost flush with the groove 13. A plasma $SiO_2$ film (second insulation film) 17 is formed on the entire surface of the silicon oxide film 12.

The hollow section 15 is obtained by selectively removing a barrier metal film formed on each sidewall of the groove 13.

The above structure results in a damascene wiring layer with a hollow section of low dielectric constant on its sides. Even when a damascene technique is used for forming a wiring layer, the wiring-to-wiring capacitance can be reduced effectively maintaining a high yield.

A method of forming a damascene wiring layer with the above structure will now be described with reference to FIGS. 2A to 2F.

Figure 2A:
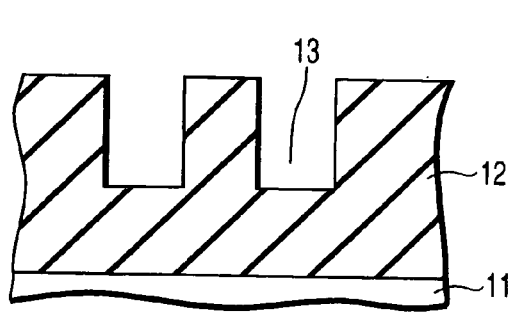
FIGS. 2A to 2F are cross-sectional views showing a process of forming the damascene wiring layer of the semiconductor device according to the first embodiment of the present invention.

First, as shown in FIG. 2A, a silicon oxide film 12 is formed directly or indirectly on a semiconductor substrate 11. A wiring pattern groove 13 is formed in a surface portion of the silicon oxide film 12 by known lithography and RIE.

Figure 2B:
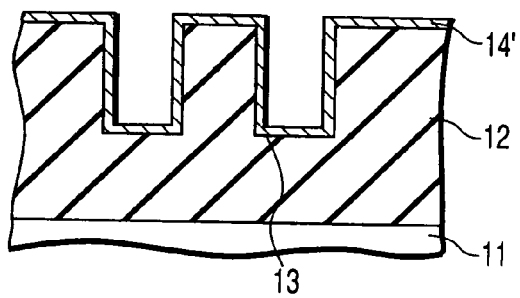

Then, as shown in FIG. 2B, a TiN film 14' serving as a barrier metal film 14 is deposited on the entire surface of the resultant structure to a given thickness. The TiN film 14' is formed by CVD (Chemical Vapor Deposition) using an organic raw-material gas.

Figure 2C:
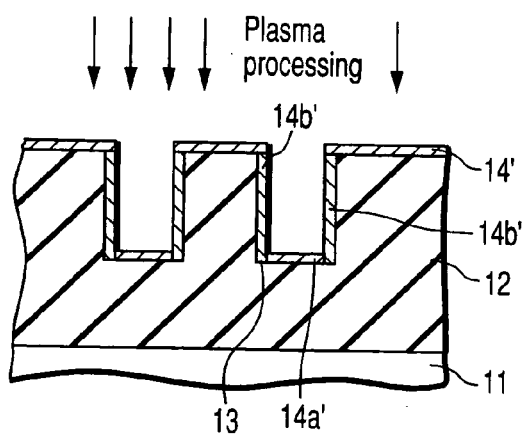

Referring to FIG. 2C, only the quality of the TiN film 14a' exposed to at least the bottom of the groove 13 is changed by anisotropic plasma processing.

The just-deposited TiN film contains a large number of organic impurities such as carbon. The TiN film is low in density and very unstable. Therefore, the TiN film should be changed to a dense one by scattering the impurities by plasma processing.

Since the plasma processing is anisotropic, the TiN film 14b formed on the sidewalls of the groove 13 is hardly exposed to plasma. The TiN film 14b' remains unstable to cause a difference in quality between the TiN film 14b, and the TiN film 14a' formed on the bottom of the wiring pattern groove 13.

Figure 2D:
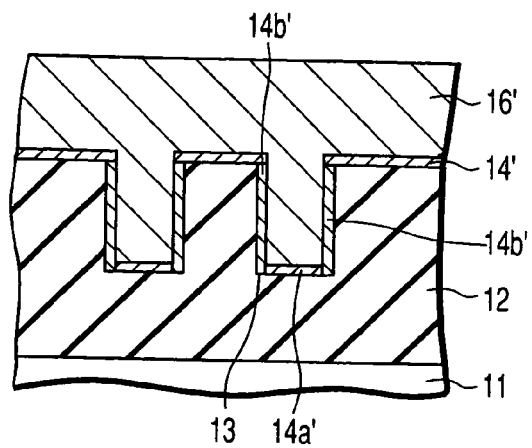

As FIG. 2D illustrates, a conductive film (e.g., W) 16', which is to serve as a wiring layer 16, is deposited on the entire surface of the resultant structure by CVD to completely fill the groove 13.

Figure 2E:
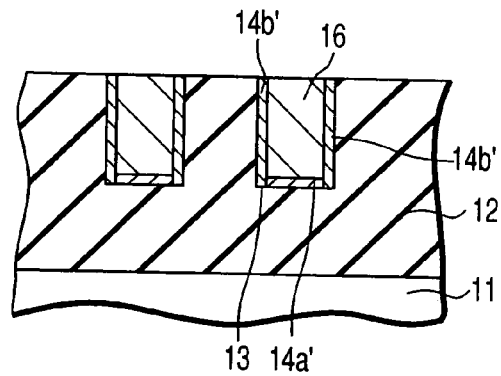

As FIG. 2E illustrates, a wiring layer 16 is formed by flattening the surface of the resultant structure by CMP. In this case, the conductive film 16' and TiN film 14' are selectively removed until the top surface of the silicon oxide film 12 is exposed and, in other words, they are selectively removed from the silicon oxide film 12 but not from inside the groove 13.

Figure 2F:
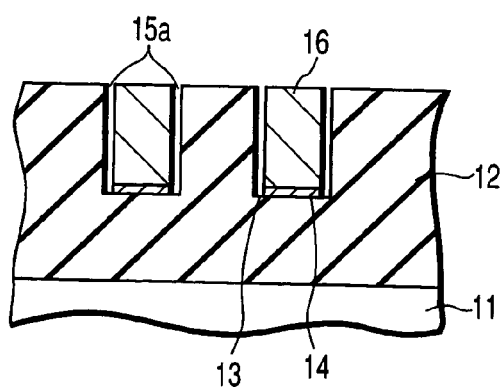

Referring to FIG. 2F, the TiN film 14b' is selectively removed from the sidewalls of the groove 13 by diluted-SH (e.g., 10% $H_2SO_4$:35% $H_2O_2$=22 litter: 9 ml, 80° C., several tens of minutes) processing. The barrier metal film 14 is thus formed only from the TiN film 14a', on the bottom of the wiring pattern groove 13. Since the TiN film 14b' on the sidewalls of the groove 13 remains unstable, the rate of wet etching is high and the TiN film 14a' can selectively be removed from the bottom of the groove 13 and the wiring layer 16.

After that, a plasma $SiO_2$ film 17 is deposited on the entire surface of the resultant structure by plasma CVD. A hollow section 15 is formed between each side of the wiring layer 16 and each sidewall of the groove 13. Thus, a semiconductor device having a damascene wiring layer as shown in FIG. 1 can be obtained.

In the first embodiment, poor burying (coverage) characteristics of the plasma $SiO_2$ film 17 prevent the film 17 from being buried into an etching region 15a excluding the TiN film 14b'. Consequently, the hollow section 15, which is capable of effectively reducing the wiring-to-wiring capacitance, can be formed easily.

(Second Embodiment)

In the above first embodiment, the etching region 15a from which the TiN film 14' is partly removed using the plasma $SiO_2$ film 17 the coverage characteristics of which are poor, is used effectively as the hollow section 15. The present invention is not limited to this feature. For example, the etching region 15a can be filled with an insulation film (fourth insulation film) 21, as illustrated in FIGS. 3A to 3C.

Figure 3A:
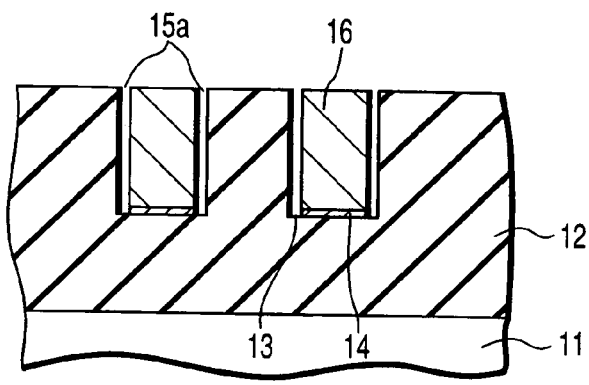
FIGS. 3A to 3C are cross-sectional views showing a process of manufacturing a semiconductor device having a damascene wiring layer (a method of forming a damascene wiring layer) according to a second embodiment of the present invention.
Figure 3B:
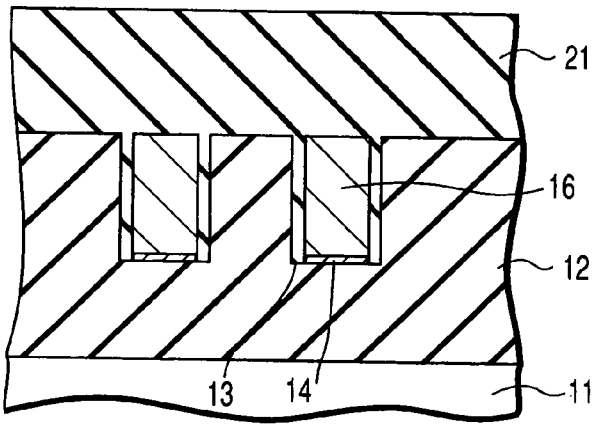
Figure 3C:
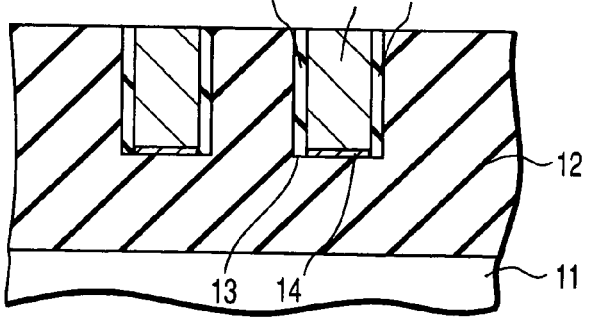

After the step shown in FIG. 3A which is the same as that shown in FIG. 2F of the first embodiment, an insulation film 21 whose burying characteristics are improved is deposited on the entire surface of the resultant structure in place of the plasma $SiO_2$ film 17, as illustrated in FIG. 3B. By flattening the insulation film 21 by CMP as shown in FIG. 3C, it is left only in the etching region 15a. For example, a TEOS (Tetraethyl Orthosilicate) film formed by plasma CVD or an SOG (Spin On Glass) film formed by coating is used as the insulation film 21.

In the second embodiment, when a damascene wiring layer is formed, the side portions of a wiring layer 16 can be used as insulation regions by substituting the insulation film 21 for regions (sidewalls of wiring pattern groove 13) in which the barrier metal film 14 is originally provided. If, therefore, the wiring pattern groove 13 is widened in advance by the thickness of the barrier metal film 14, an increase in wiring resistance due to microfabrication can be suppressed effectively.

(Third Embodiment)

Figure 4A:
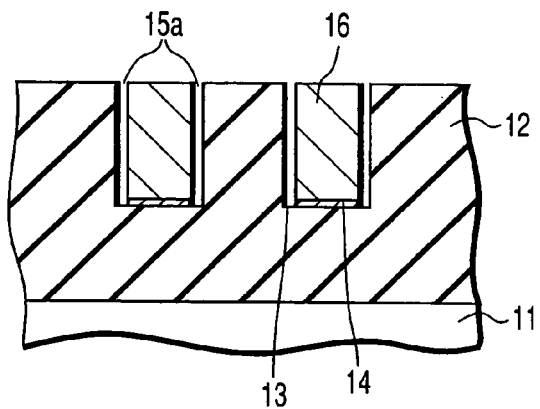
FIGS. 4A to 4C are cross-sectional views showing a process of manufacturing a semiconductor device having a damascene wiring layer (a method of forming a damascene wiring layer) according to a third embodiment of the present invention.
Figure 4B:
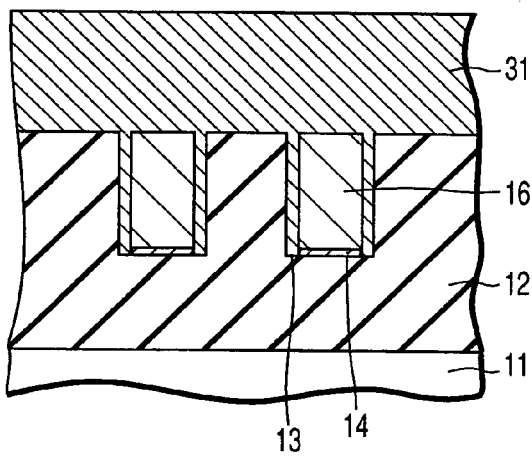
Figure 4C:
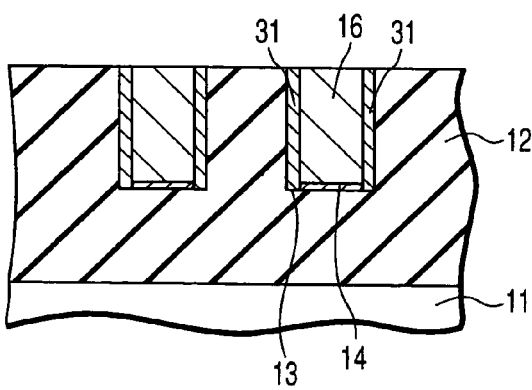

FIGS. 4A to 4C schematically show a process of manufacturing a semiconductor device having a damascene wiring layer (a method of forming a damascene wiring layer) according to a third embodiment of the present invention. In the third embodiment, the process up to the step of selectively removing the TiN film 14b from the sidewalls of the wiring pattern groove 13 is the same as that shown in FIGS. 2A to 2F of the first embodiment. The steps subsequent thereto will now be described below.

The TiN film 14b' is selectively removed from the sidewalls of the groove 13 by SC-2 processing to form a barrier metal film 14 (see FIG. 4A). Then, a W film (second conductive film) 31 is deposited on the entire surface of the resultant structure by sputtering or CVD, as shown in FIG. 4B.

As FIG. 4C illustrates, the resultant structure is flattened by CMP and the W film 31 is removed until the top surface of a silicon oxide film 12 is exposed. Thus, an etching region 15a between each side of the wiring layer 16 and each sidewall of the groove 13 is completely filled with the W film 31.

In the third embodiment, too, the side portions of the wiring layer 16 can be used as wiring regions by substituting the W film 31 for regions (sidewalls of the groove 13) in which the barrier metal film 14 is originally provided. The line width of a damascene wiring layer can thus be increased by the thickness of the barrier metal film 14. In other words, the region corresponding to the thickness of the barrier metal film 14 can be used as a wiring layer without waste. A semiconductor device with the above damascene wiring layer can be microfacbricated without increasing the resistance of wiring.

Not only the W film but also any other conductive film can be used as the second conductive film that is buried into the etching region 15a.

(Fourth Embodiment)

In the first to third embodiments, a spacer (third insulation film) can be provided on each sidewall of the wiring pattern groove 13.

FIGS. 5A to 5G schematically show a process of manufacturing a semiconductor device having a damascene wiring layer (a method of forming a damascene wiring layer) according to a fourth embodiment of the present invention. The fourth embodiment will now be described in brief, taking the first embodiment in which the hollow section 15 is provided between each sidewall of the wiring pattern groove 13 and each side of the wiring layer 16 as an example.

A silicon oxide film 12 is formed directly or indirectly on a semiconductor substrate 11. A wiring pattern groove 13 is formed in a surface portion of the silicon oxide film 12 by known lithography and RIE. After that, a SiN (silicon nitride) film serving as a third insulation film is deposited on the surface of the silicon oxide film 12 by CVD. Then, the SiN film is selectively removed by anisotropic etching and left only on each sidewall of the groove 13, thereby forming a spacer 41 (see FIG. 5A).

If the same steps as those of FIGS. 2B et seq. are executed after the above step, a semiconductor device having a damascene wiring layer can be obtained in which the spacer 41 is provided on each sidewall of the groove 13 and the hollow section 15 is formed between the spacer 41 and each side of the wiring layer 16.

The structure of the fourth embodiment can produce an advantage as well as that of the first embodiment. Not only wiring-to-wiring capacitance can effectively be reduced maintaining a high yield, but also wiring-to-wiring insulating characteristics can be improved further. The semiconductor device can thus be microfabricated more greatly.

In the fourth embodiment, too, an insulation film 21, a W film or the like can easily be buried into the etching region 15a in place of the hollow section 15, as in the second and third embodiments described above.

(Fifth Embodiment)

FIGS. 6A to 6E schematically show a process of manufacturing a semiconductor device having a damascene wiring layer (a method of forming a damascene wiring layer) according to a fifth embodiment of the present invention. The fifth embodiment is directed to a case where a hollow section 15 is formed by removing the spacer 41, which is formed on each sidewall of the wiring pattern groove 13 in the fourth embodiment.

Figure 6A:
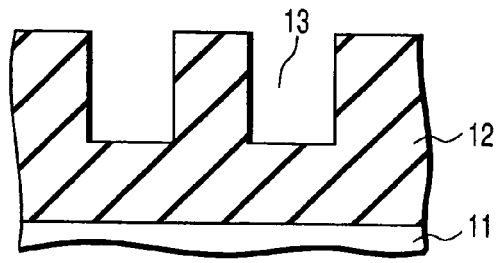
FIGS. 6A to 6E are cross-sectional views showing a process of manufacturing a semiconductor device having a damascene wiring layer (a method of forming a damascene wiring layer) according to a fifth embodiment of the present invention.

Referring first to FIG. 6A, a silicon oxide film 12 is formed directly or indirectly on a semiconductor substrate 11 and a wiring pattern groove 13 is formed in a surface portion of the silicon oxide film 12 by known lithography and RIE.

Figure 6B:
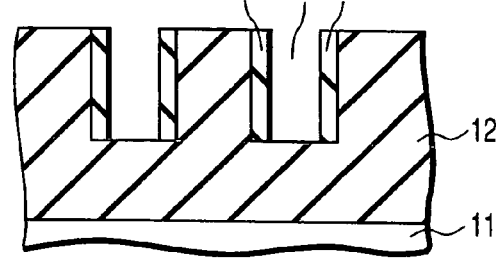

After that, as shown in FIG. 6B, a SiN film serving as a third insulation film is deposited on the surface of the silicon oxide film 12 by CVD. The SiN film is selectively removed by anisotropic etching and left only on each sidewall of the groove 13, resulting in spacers 41.

Figure 6C:
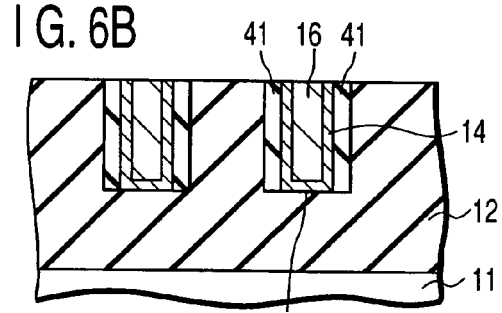

A TiN film serving as a barrier metal film 14 is deposited on the entire surface of the resultant structure and a W film serving as a wiring layer 16 is deposited thereon. As FIG. 6C illustrates, the resultant structure is flattened by CMP until the top surface of the silicon oxide film 12 is exposed, resulting in the barrier metal film 14 and the wring layer 16.

Figure 6D:
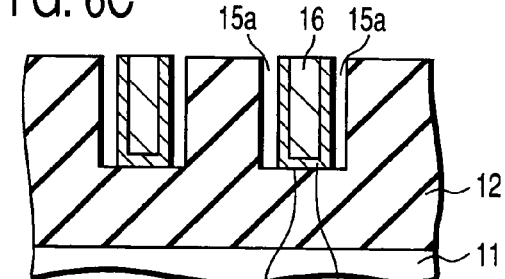

Wet etching in phosphoric acid allows the spacers 41 to be selectively removed from the sidewalls of the groove 13, as shown in FIG. 6D.

Figure 6E:
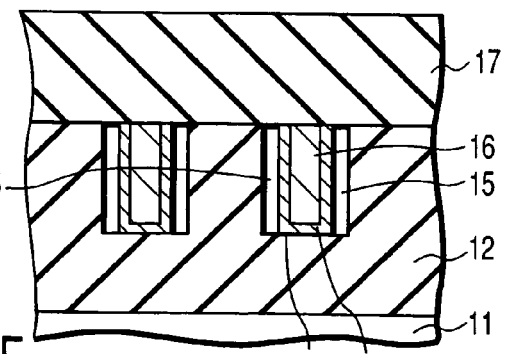
Figure 5A:
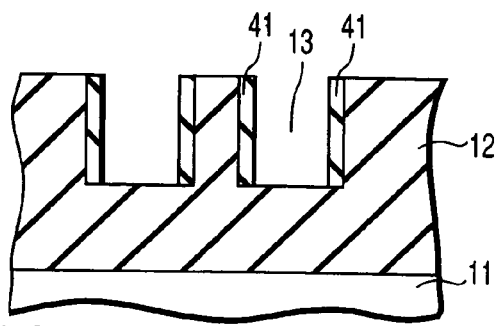
FIGS. 5A to 5G are cross-sectional views showing a process of manufacturing a semiconductor device having a damascene wiring layer (a method of forming a damascene wiring layer) according to a fourth embodiment of the present invention.
Figure 5B:
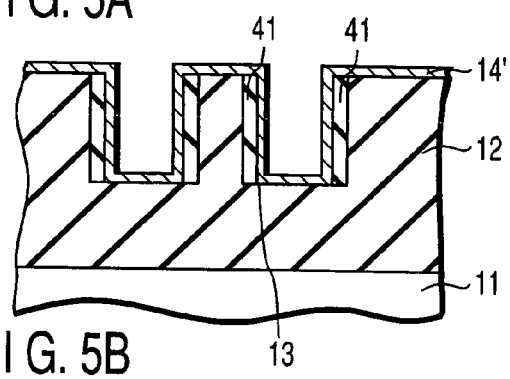
Figure 5C:
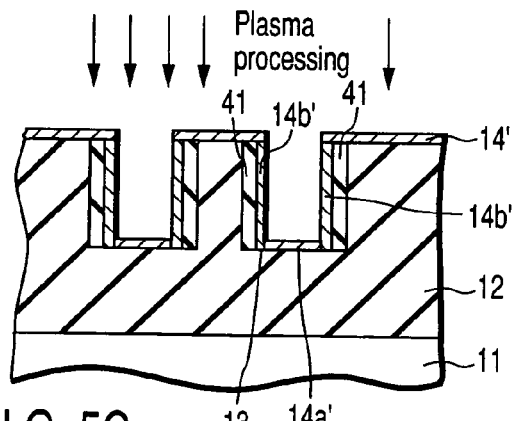
Figure 5D:
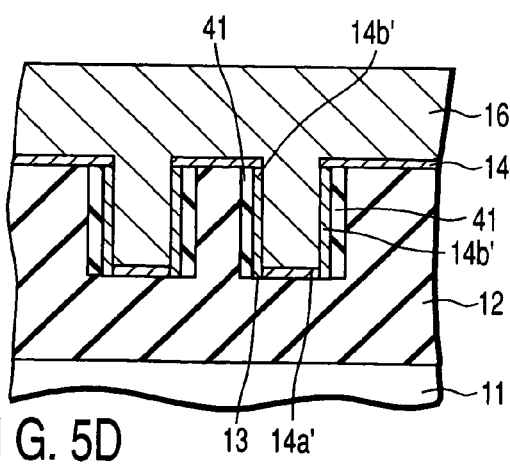
Figure 5E:
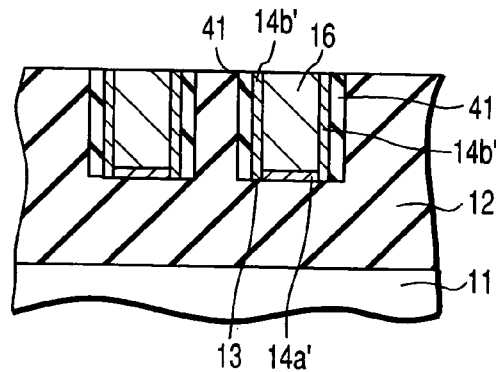
Figure 5F:
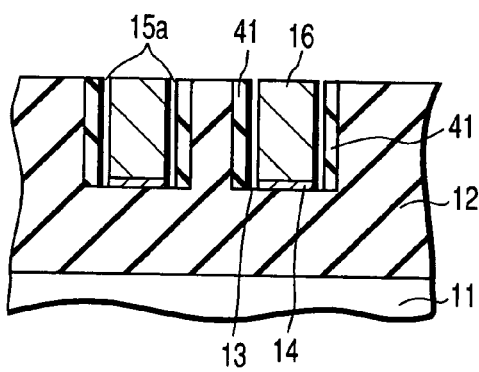
Figure 5G:
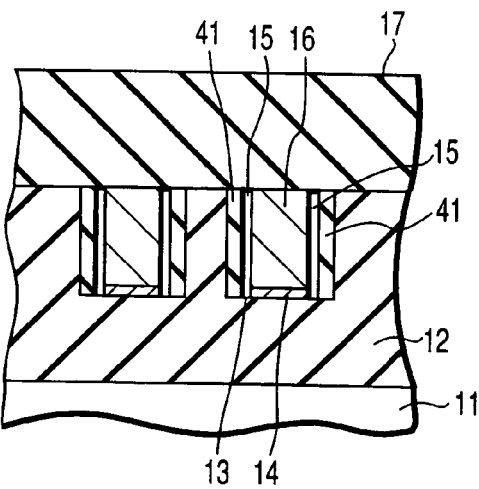

Referring to FIG. 6E, a plasma $SiO_2$ film 17 is deposited on the entire surface of the resultant structure by plasma CVD. The film 17 inhibits the etching region 15a excluding the spacers 41 from being filled completely. Consequently, a semiconductor device having a damascene wiring layer can be manufactured in which a hollow section 15 is provided along each sidewall of the groove 13.

The etching region 15a is therefore prevented from being filled completely using a film of poor coverage characteristics such as plasma $SiO_2$ on purpose. As in the first embodiment, the hollow section 15 can easily be formed along each sidewall of the wiring pattern groove 13 excluding the spacers 41. The section 15 allows the wiring-to-wiring capacitance to be reduced effectively.

According to the fifth embodiment, the hollow section 15 can be formed along each side of the wiring layer 16 with good controllability even when the barrier metal film 14 is difficult to selectively remove from the wiring layer 16 or even though no anisotropic plasma processing is executed.

(Sixth Embodiment)

FIGS. 7A to 7E schematically show a process of manufacturing a semiconductor device having a damascene wiring layer (a method of forming a damascene wiring layer) according to a sixth embodiment of the present invention. The sixth embodiment is directed to a DRAM cell using a stacked capacitor. In the sixth embodiment, the process up to the step of forming the wiring layer 16 is the same as that shown in FIGS. 2A to 2E of the first embodiment. The steps subsequent thereto will now be described below.

After the wiring layer 16 is formed by executing the same steps as those of FIGS. 2A to 2E (see FIG. 7A), it is selectively removed by RIE using $Cl_2$ gas. Thus, a bit line 51 is formed lower than the top surface of the silicon oxide film 12 (see FIG. 7B).

As in the first embodiment, a TiN film 14b' is selectively removed from each sidewall of the wiring pattern groove 13 by SC-2 processing. Thus, a barrier metal film 14 is formed from only the TiN film 14a, on the bottom of the groove 13 (see FIG. 7C).

A silicon nitride film 52 is deposited on the entire surface of the resultant structure by CVD. An etching region 15a excluding the TiN film 14b' and a step region 15b formed by etching the wiring layer 16 are completely filled with the silicon nitride film 52. Then, the film 52 is flattened by CMP such that it is flush with the top surface of the silicon oxide film 12, thus forming a sidewall (fifth insulation film) 53 in the etching region 15a (see FIG. 7D).

A photoresist film (not shown) is formed on the silicon oxide film 12 and patterned by known lithography. The photoresist film and silicon nitride film 52 are removed by RIE using $C_4F_8$ gas having a high selection ratio. The silicon oxide film 12 is selectively etched to form a contact hole 54 reaching the semiconductor substrate 11. The contact hole 54 is formed in self-alignment with the silicon nitride film 52 (see FIG. 7E).

Figure 7A:
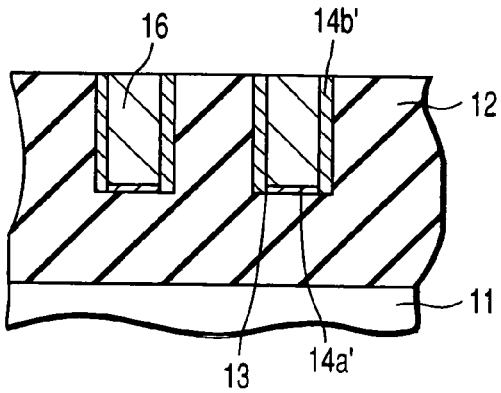
FIGS. 7A to 7F are cross-sectional views showing a process of manufacturing an example of a semiconductor device according to a sixth embodiment of the present invention, which is applied to a DRAM cell using a stacked capacitor.
Figure 7B:
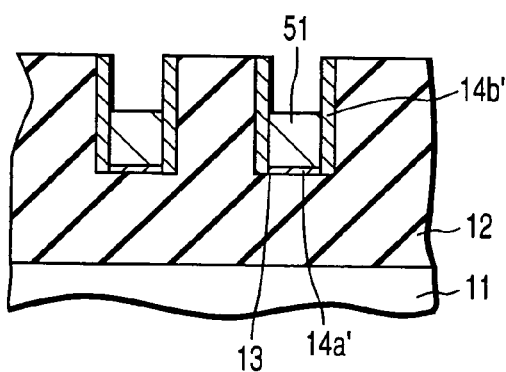
Figure 7C:
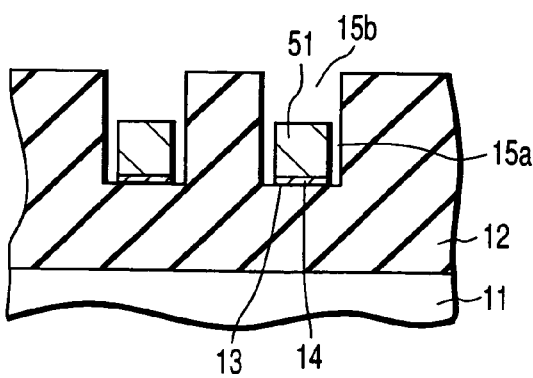
Figure 7D:
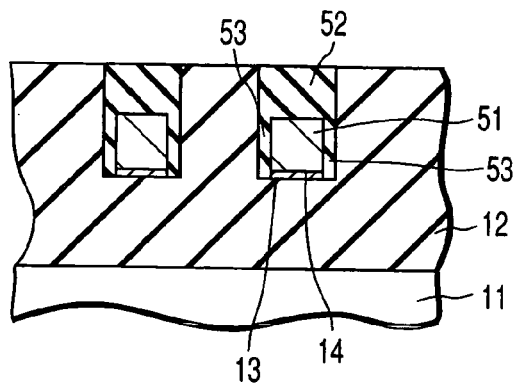
Figure 7E:
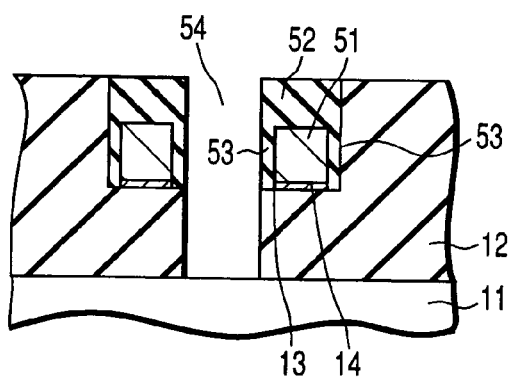
Figure 7F:
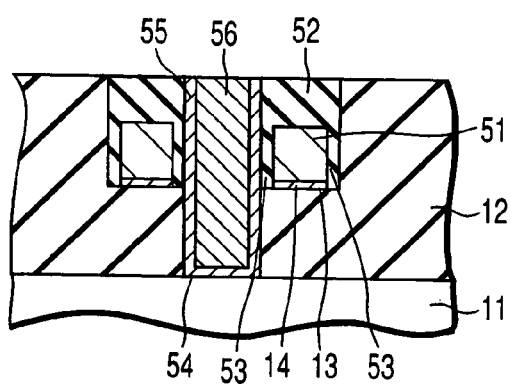
Figure 9A:
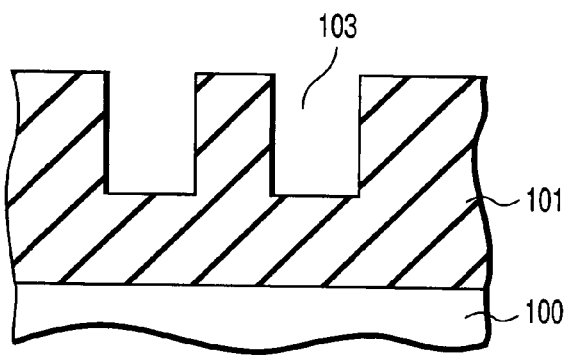
FIGS. 9A to 9C are cross-sectional views showing a process of manufacturing a semiconductor device having a damascene wiring layer (a method of forming a damascene wiring layer) in order to describe a prior art technique and its problems.
Figure 9B:
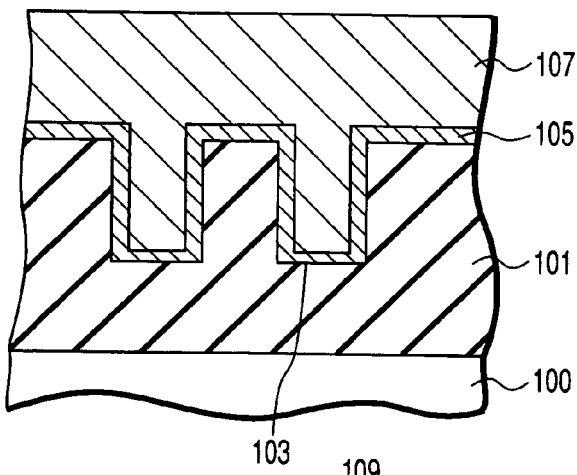
Figure 9C:
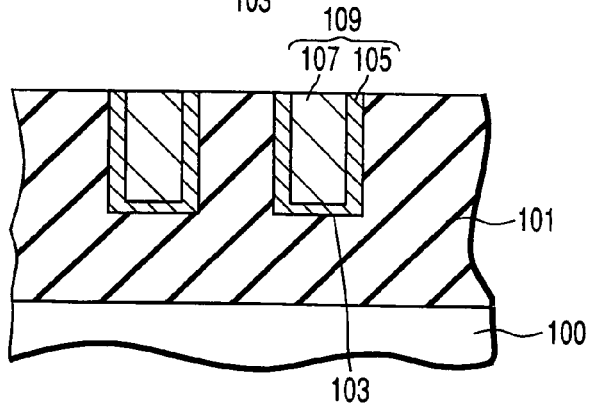
Figure 10A:
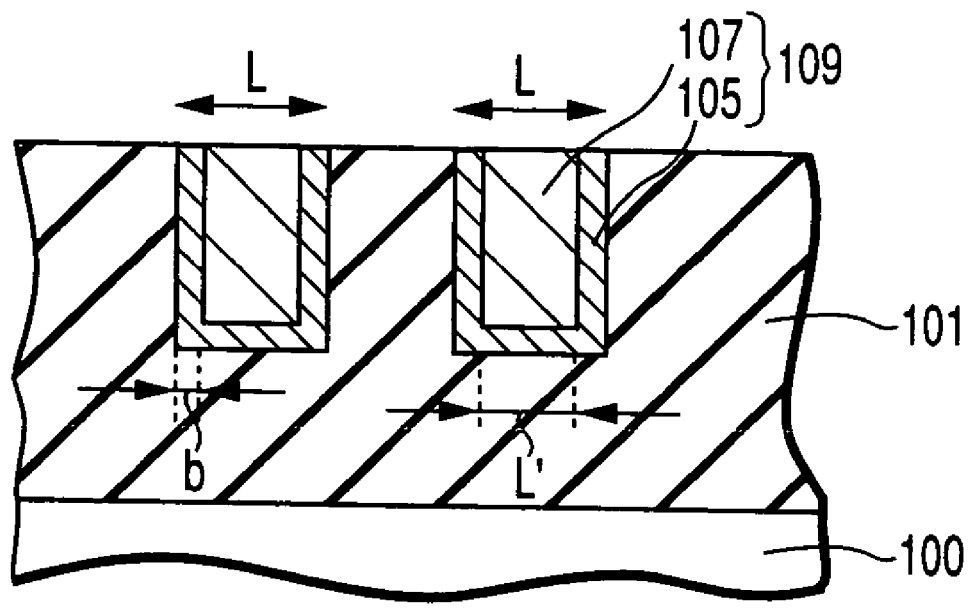
FIGS. 10A and 10B are cross-sectional views showing a damascene wiring layer and an RIE wiring layer having the same line width in the prior art technique for purposes of comparison.
Figure 10B:
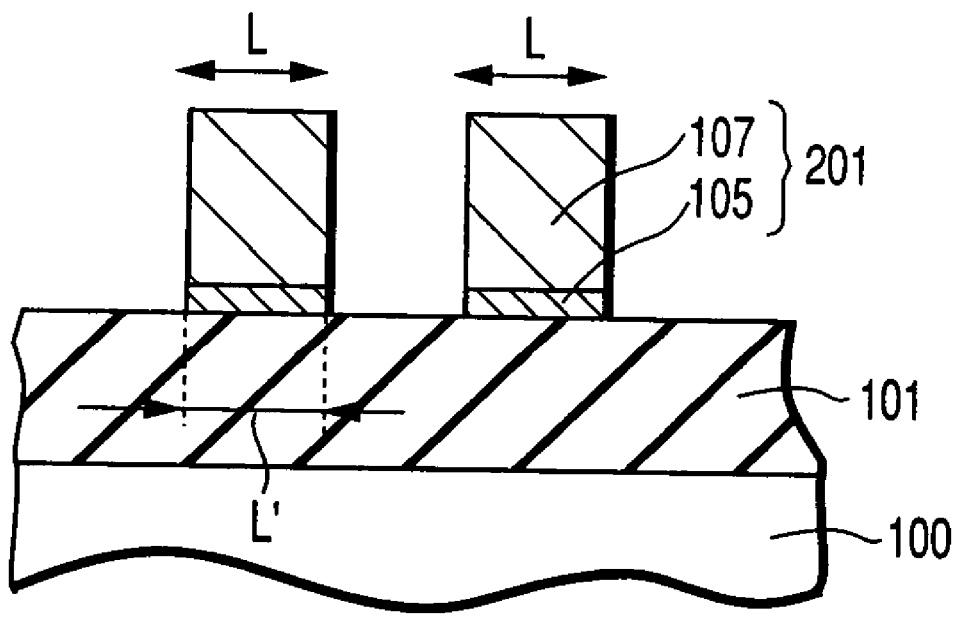

After the photoresist film is eliminated, a TiN film serving as a barrier metal film (third conductive film) 55 and a conductive film (e.g., tungsten) serving as a storage node contact (fourth conductive film) 56 are deposited on the entire surface of the resultant structure by CVD to fill the contact hole 54 completely. By flattening the structure by CMP until the top surface of the silicon oxide film 12 is exposed, a contact plug is formed of the barrier metal film 55 and the storage node contact 56 (see FIG. 7F).

After that, a capacitor and a plate electrode are formed in the same manner as those of the normal DRAM cell.

According to the sixth embodiment, the storage node contact 56 can be formed in self-alignment with the bit line 51 in a DRAM cell using a stacked capacitor. No margin for alignment is required for forming the contact hole 54. Therefore, a distance between bit lines 51 can sufficiently be reduced and the chip size can easily be decreased.

In particular, sidewalls 53 for insulating the bit lines 51 and the storage contact 56 from each other are formed at the same time when the silicon nitride film 52 is buried into the step region 15b. The number of manufacturing steps can thus be reduced. Moreover, the regions (side portions of the bit lines 51) that correspond to those occupied by the barrier metal film can effectively be used as the sidewalls 53. Consequently, a so-called thinning effect of increasing the resistance of the bit lines 51 can easily be suppressed.

In the embodiment described above, the step region 15b (bit line 51) is formed by selectively etching the wiring layer 16 and then the TiN film 14b' is removed from each sidewall of the wiring pattern groove 13. The present invention is not limited to this structure. For example, the bit line 51 can easily be formed after the TiN film 14b' is selectively removed.

If the present invention is applied to the DRAM cell using a stacked capacitor, a spacer (fifth insulation film) 41' can be provided at least between the wiring pattern groove 13 and the contact hole 54, as illustrated in FIG. 8. In this case, a hollow section 15 can be formed between the bit line 51 and the spacer 41' as in the fourth embodiment (see FIGS. 5A to 5G). The capacitance between the bit line 51 and the storage node contact 56 can effectively be reduced.

As described above, the sidewalls of the wiring pattern groove can effectively be utilized. In other words, a hollow section is formed, an insulation is buried, or a conductive film is buried between each sidewall of the wiring pattern groove and each side of the wiring layer in the damascene wiring layer. When the hollow section is formed, the wiring-to-wiring capacitance can be prevented from increasing. When the insulation film is buried, the wiring-to-wiring insulation characteristics can be improved. When the conductive film is buried, an increase in wiring resistance due to the thinning effect can be prevented. This is very effective in miniaturizing a semiconductor device and decreasing the size of a chip. The suppression of the thinning effect effectively allows the wiring resistance to decrease and allows the wiring-to-wiring capacitance to reduce, with the result that the semiconductor device can easily be improved in performance.

In the foregoing embodiments of the present invention, a hollow section is provided along each sidewall of the wiring pattern groove. The present invention is not limited to this structure. The hollow section can be provided only on the sidewall adjacent to at least another damascene wiring layer.

According to the present invention described above, there can be provided a semiconductor device capable of preventing a wiring resistance and a wiring-to-wiring capacitance from increasing and easily improving in performance and a method of manufacturing the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising:
    forming a groove section in a first insulation film provided above a semiconductor substrate;
    forming a third insulation film on at least one sidewall portion of the groove section;
    forming a first conductive film in the groove section along the third insulation film;
    forming a buried wiring layer in the groove section with the first conductive film interposed therebetween; and
    selectively removing the third insulation film from at least one sidewall portion of the groove section to form a space region between the sidewall portion and one side of the wiring layer.

2. The method according to claim 1, wherein the first conductive film is barrier metal and has resistivity that is higher than that of the wiring layer.

3. The method according to claim 1, further comprising causing the first conductive film of a bottom of the groove section and that of each sidewall of the groove to differ in quality from each other.

4. The method according to claim 1, wherein the first conductive film and the wiring layer are flattened such that top surfaces of the first conductive film and the wiring layer are almost flush with a top surface of the first insulation film.

5. The method according to claim 1, further comprising forming a second insulation film on the first insulation film after the space region is formed.

6. The method according to claim 5, wherein the second insulation film is poor in being buried in the space region.

7. A method of manufacturing a semiconductor device, comprising:
    forming at least two groove sections in a first insulation film provided above a semiconductor substrate;
    forming a first conductive film on the first insulation film along each of the two groove sections;
    forming a buried wiring layer in each of the two groove section with the first conductive film interposed therebetween;
    selectively removing the first conductive film from at least one sidewall portion of each of the two groove section; and
    forming a contact plug between the two groove sections with a fifth insulation film interposed therebetween.

8. The method according to claim 7, wherein the fifth insulation film is formed on a sidewall portion of each of the two groove sections after the first conductive film is selectively removed.

9. The method according to claim 7, wherein the fifth insulation film is formed on at least one sidewall portion of each of the two groove sections after the two groove sections are formed.

10. The method according to claim 9, wherein a space region is provided between the fifth insulation film and the wiring layer.

11. The method according to claim 7, wherein the first conductive film is barrier metal and has resistivity that is higher than that of the wiring layer.

12. The method according to claim 7, wherein the wiring layer is selectively etched such that a level of a top surface of the wiring layer is equal to or lower than that of a top surface of the first insulation film.

13. The method according to claim 12, wherein the wiring layer is a bit line.

14. The method according to claim 7, wherein the contact plug is formed in self-alignment with the fifth insulation film.

15. The method according to claim 7, wherein the contact plug includes barrier metal of a third conductive film and a storage node contact of a fourth conductive film.

16. A method of manufacturing a semiconductor device, comprising:
   forming a groove section in a first insulation film provided above a semiconductor substrate;
   forming a first conductive film on the first insulation film along the groove section;
   causing the first conductive film of a bottom of the groove section and that of each sidewall of the groove section to differ in quality from each other;
   forming a buried wiring layer in the groove section with the first conductive film interposed therebetween; and
   selectively removing the first conductive film from at least one sidewall portion of the groove section to form a space region between the sidewall portion and one side of the wiring layer.

17. A method of manufacturing a semiconductor device, comprising:
   forming a groove section in a first insulation film provided above a semiconductor substrate;
   forming a first conductive film on the first insulation film along the groove section;
   forming a buried wiring layer in the groove section with the first conductive film interposed therebetween;
   selectively removing the first conductive film from at least one sidewall portion of the groove section to form a space region between the sidewall portion and one side of the wiring layer; and
   forming a second insulation film on the first insulation film after the space region is formed.

18. The method according to claim 17, wherein the second insulation film is poor in being buried in the space region.

19. A method of manufacturing a semiconductor device, comprising:
   forming a groove section in a first insulation film provided above a semiconductor substrate;
   forming a second insulation film on a sidewall portion of the groove section;
   forming a first conductive film on the first insulation film along the groove section;
   forming a buried wiring layer in the groove section with the first conductive film interposed therebetween; and
   selectively removing the first conductive film from at least one sidewall portion of the groove section to form a space region between the sidewall portion and one side of the wiring layer.

20. A method of manufacturing a semiconductor device, comprising:
   forming a groove section in a first insulation film provided above a semiconductor substrate;
   forming a first conductive film on the first insulation film along the groove section;
   forming a buried wiring layer in the groove section with the first conductive film interposed therebetween;
   selectively removing the first conductive film from at least one sidewall portion of the groove section to form a space region between the sidewall portion and one side of the wiring layer; and
   burying a second insulation film in the space region.

21. The method according to claim 20, wherein the second insulation film is good at being buried in the space region.

* * * * *